United States Patent
Hwang et al.

(10) Patent No.: US 9,160,520 B1
(45) Date of Patent: Oct. 13, 2015

(54) SERIALIZER AND SERIALIZING APPARATUS USING THE SAME

(71) Applicant: SK hynix Inc., Gyeonggi-do (KR)

(72) Inventors: Yong-Seok Hwang, Gyeonggi-do (KR); Sung-Jin Lee, Gyeonggi-do (KR); Min-Soon Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/661,842

(22) Filed: Mar. 18, 2015

(30) Foreign Application Priority Data

Nov. 17, 2014 (KR) ........................ 10-2014-0159918

(51) Int. Cl.
*H04L 25/40* (2006.01)
*H04L 7/027* (2006.01)

(52) U.S. Cl.
CPC ..................................... *H04L 7/027* (2013.01)

(58) Field of Classification Search
USPC ............ 375/371, 354; 327/141, 254; 341/100
See application file for complete search history.

(56) References Cited

U.S. PATENT DOCUMENTS

| 2009/0219764 | A1* | 9/2009 | Shin et al. ................ 365/189.02 |
| 2014/0281652 | A1* | 9/2014 | Methar et al. ................ 713/400 |
| 2014/0312940 | A1* | 10/2014 | Lee .............................. 327/141 |

OTHER PUBLICATIONS

Jeong, Y., et al., 0.37mW/Gb/s Low Power SLVS Transmitter for Battery Powered Applications, 2012 IEEE International Symposium on Circuits and Systems (ISCAS), May 2012, pp. 1955-1958.

* cited by examiner

*Primary Examiner* — Khai Tran
(74) *Attorney, Agent, or Firm* — IP & T Group LLP

(57) ABSTRACT

Provided are a serializer that synchronizes data with a clock by using an inversion clock and a high speed serializing apparatus using both a serializer and a serializer including shift registers. Such a serializer may include a first synchronization unit suitable for synchronizing input data with a first synchronization clock, a multiplexer suitable for serializing output data of the first synchronization unit based on the first synchronization clock, and a second synchronization unit suitable for synchronizing output data of the multiplexer with a second synchronization clock which is different from the first synchronization clock in frequency.

11 Claims, 4 Drawing Sheets

SERIALIZER AND SERIALIZING APPARATUS USING THE SAME

CROSS-REFERENCE TO RELATED APPLICATIONS

The present application claims priority of Korean Patent Application No. 10-2014-0159918, filed on Nov. 17, 2014, which is incorporated herein by reference in its entirety.

BACKGROUND

1. Field

Exemplary embodiments of the present invention relate to a serializer for converting parallel data into serial data, a high speed serializing apparatus using the same and, more particularly, a serializer that synchronizes data with a clock and a high speed serializing apparatus using the same.

2. Description of the Related Art

In electronic interfaces, a high speed data serializing apparatus is generally used to convert low speed parallel data into high speed serial data based on a high speed clock, and transmits the high speed serial data.

However, this sometimes results in invalid data being output, due to glitches and clock skew, for example.

In serializing data using shift registers, there are often problems associated with clock loading effects. When multiple 2:1 serializers are used, since there are multiple clocks, skew may occur between the clocks.

SUMMARY

Various embodiments are directed to a serializer that synchronizes data with a plurality of clocks having different frequencies.

Various embodiments are directed to a high speed serializing apparatus using both a serializer that synchronizes data with a plurality of clocks having different frequencies and a serializer including shift registers.

In an embodiment, a serializer may include: a first synchronization unit suitable for synchronizing input data with a first synchronization clock; a multiplexer suitable for serializing output data of the first synchronization unit based on the first synchronization clock; and a second synchronization unit suitable for synchronizing output data of the multiplexer with a second synchronization clock which is different from the first synchronization clock in frequency.

The second synchronization clock may have a frequency higher than that of the first synchronization clock.

The first synchronization unit may include: a divider suitable for dividing a frequency of the second synchronization clock by a predetermined multiple and outputting the first synchronization clock; a first D flip-flop suitable for synchronizing first input data with the first synchronization clock; and a second D flip-flop suitable for synchronizing second input data with the first synchronization clock.

The second synchronization unit may include: an inverter suitable for inverting the second synchronization clock to output an inverted second synchronization clock; and a third D flip-flop suitable for synchronizing the output data of the multiplexer with the inverted second synchronization clock.

In an embodiment, a serializing apparatus may include: at least one first serializer suitable for serializing data by synchronizing data at an input stage with a first synchronization clock and synchronizing data at an output stage with a second synchronization clock having a frequency higher than that of the first synchronization clock by a predetermined multiple; and a second serializer suitable for serializing data outputted from the first serializer.

The second serializer may include shift registers.

The first serializer may include: a first synchronization unit suitable for synchronizing input data with the first synchronization clock; a multiplexer suitable for serializing output data of the first synchronization unit based on the first synchronization clock; and a second synchronization unit suitable for synchronizing output data of the multiplexer with the second synchronization clock.

The first synchronization unit may include: a divider suitable for dividing a frequency of a second synchronization clock by the predetermined multiple to output the first synchronization clock; a first D flip-flop suitable for synchronizing first input data with the first synchronization clock; and a second D flip-flop suitable for synchronizing second input data with the first synchronization clock.

The second synchronization unit may Include: an inverter suitable for inverting the second synchronization clock to output an inverted second synchronization clock; and a third D flip-flop suitable for synchronizing data serialized in the multiplexer with the inverted second synchronization clock.

The second serializer may include: a first serializing unit suitable for serializing even-bit data of the data outputted from the first serializer by using a plurality of first shift registers based on a third synchronization clock; a second serializing unit suitable for serializing odd-bit data of the data outputted from the first serializer by using a plurality of second shift registers in response to an inverted third synchronization clock; and a multiplexer suitable for serializing the even-bit data outputted from the first serializing unit and the odd-bit data outputted from the second serializing unit in response to the third synchronization clock.

The third synchronization clock may have a frequency higher than that of the second synchronization clock by a multiple.

According to an embodiment of the present invention, it is possible to reduce clock skew error as compared with an existing multiple 2:1 serialization scheme.

Furthermore, the embodiment of the present invention includes a third D flip-flop provided at an output stage to have a structure less affected by glitches which may occur in an initial state.

Furthermore, the embodiment of the present invention has a structure using shift registers after data loading, thereby synchronizing data with a clock without any errors.

Consequently, an embodiment of the present invention uses both a serializer that synchronizes data with a clock based on an inversion clock and a serializer including shift registers, thereby efficiently performing high speed serializing operation of Gbits/s or more without any errors.

DETAILED DESCRIPTION

Figure 1:
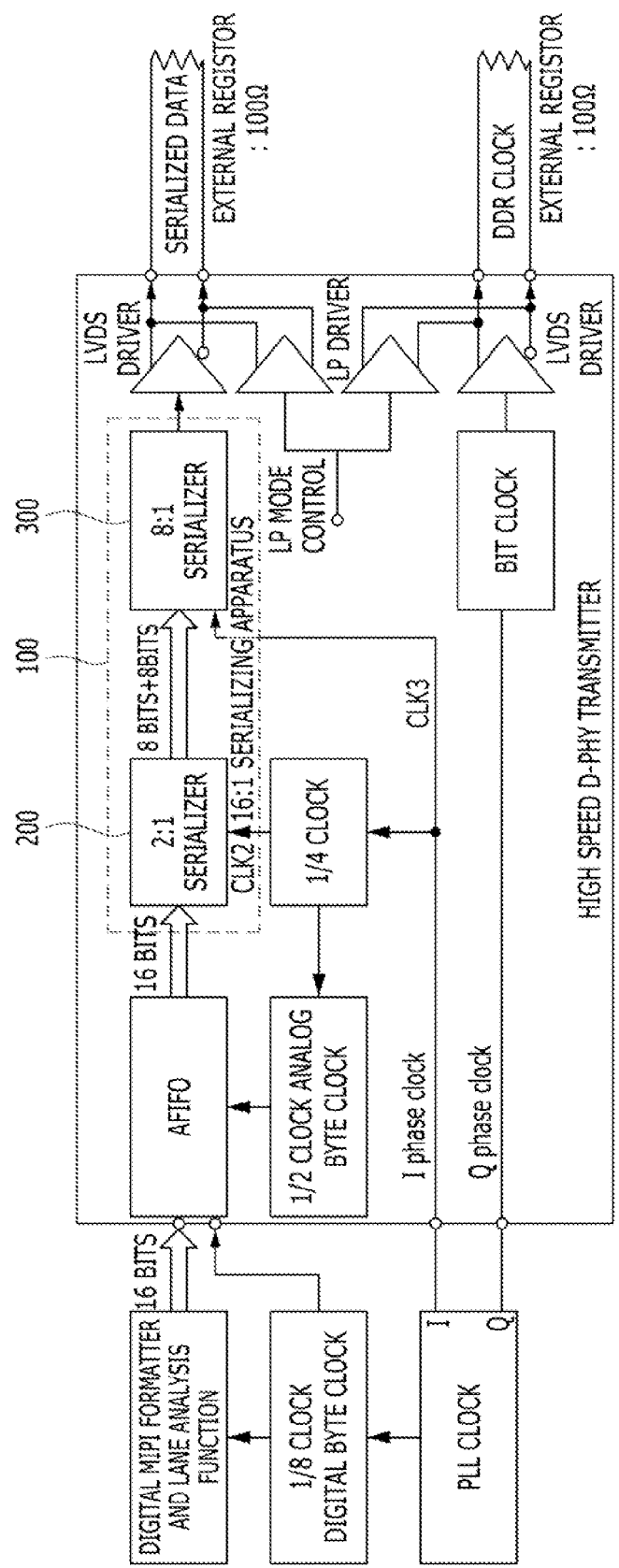
FIG. 1 is a configuration diagram illustrating a high speed D-PHY transmitter employing a high speed serializing apparatus in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments.

The technical scope of the present invention will be described in brief as follows.

In general, in order to reduce clock skew occurring when a high speed data serializing apparatus operates at high speed based on a high speed clock, data may be serialized using shift registers or 2:1 serializers. However, in serializing data using the shift registers, a high speed data serializing apparatus may have difficulty operating due to clock loading effects. Furthermore, in serializing data by using 2:1 serializers, since a plurality of clocks are used, skew may occur in the clocks.

In an embodiment of the present invention, both a serializer that synchronizes data with a clock based on an inversion clock and a serializer including shift registers are used, so that it is possible to perform high speed serializing operations of Gbits/s or more without errors.

In other words, in an embodiment of the present invention, either or both a 2:1 serializer, which synchronizes data with a clock based on an inversion clock, and an 8:1 serializer, including shift registers, may be used. A synchronization block of the 2:1 serializer may be implemented with a ½ divider, an inverter, and a plurality of D flip-flops.

This will be described in detail with reference to FIG. 1 to FIG. 4 as follows.

FIG. 1 is a configuration diagram of a high speed D-PHY transmitter employing a high speed serializing apparatus in accordance with an embodiment of the present invention and, since other elements, for example, a Low-Voltage Differential Signaling (LVDS) driver, a low-power (LP) driver and the like, except for a 16:1 serializing apparatus 100, are well-known in the art, descriptions thereof will be omitted to avoid redundancy.

As illustrated in FIG. 1, the 16:1 serializing apparatus 100 corresponding to a high speed serializing apparatus in accordance with an embodiment of the present invention includes a 2:1 serializer 200 and an 8:1 serializer 300. The 2:1 serializer 200 serializes data to 2:1 by synchronizing data at an input stage with an analog byte clock and synchronizes data at an output stage with an inverted 2× analog byte clock. The analog byte clock is referred to as a first synchronization clock CLK1, and a 2× analog byte clock is referred to as a second synchronization clock CLK2 having a frequency higher than that of the first synchronization clock CLK1 by a predetermined multiple and the inverted 2× analog byte clock is referred to as an inverted second synchronization clock CLKB2. The 8:1 serializer 300 serializes data outputted from the 2:1 serializer 200 to 8:1 by using shift registers.

As described above, the 16:1 serializing apparatus 100 in accordance with an embodiment of the present invention uses the 2:1 serializer 200 in a low speed clock period, i.e., a low frequency band, and the 8:1 serializer 300 including shift registers for clock synchronization in a high speed clock period, i.e., a high frequency band. To remove glitch or a skew between clocks, the 2:1 serializer 200 controls input and output of a multiplexer (220 of FIG. 2) by using first and second D flip-flops (212 and 213 of FIG. 2) and the first synchronization clock CLK1 having a half frequency as compared with the second synchronization clock CLK2. Furthermore, at an output stage of the 2:1 serializer 200, data are outputted in a section in which a set-up and hold margin of a third D flip-flop (232 of FIG. 2) is optimal, by using the inverted second synchronization clock CLKB2. Then, the 8:1 serializer 300 speeds up data transmission speed by using the shift registers.

In the 16:1 serializing apparatus 100 in accordance with the embodiment of the present invention, 16-bit parallel input data is serialized by the 2:1 serializer 200 in units of 8 bits. Then, the data in units of 8 bits is divided into even-bit data and odd-bit data by the 8:1 serializer 300 in order to realize a double data rate (DDR) scheme. For this, the shift registers (311 to 314 and 322 to 325 of FIG. 3) of the 8:1 serializer 300 are seriated to 4:1 and serialize the data outputted from the 2:1 serializer 200, and a multiplexer (330 of FIG. 3) of the 8:1 serializer 300 serializes the data serialized to 4:1 by the shift registers to 2:1 again, so that finally serialized data is outputted.

In an embodiment of the present invention, as described above, an example has been used in which the 16:1 serializing apparatus 100 is implemented with a 2:1 serializer 200 and a 8:1 serializer 300. However, a 16:1 serializing apparatus may also be implemented with two 2:1 serializers and a 4:1 serializer. Furthermore, a 32:1 serializing apparatus may also be realized using two 2:1 serializers and an 8:1 serializer.

Figure 2:
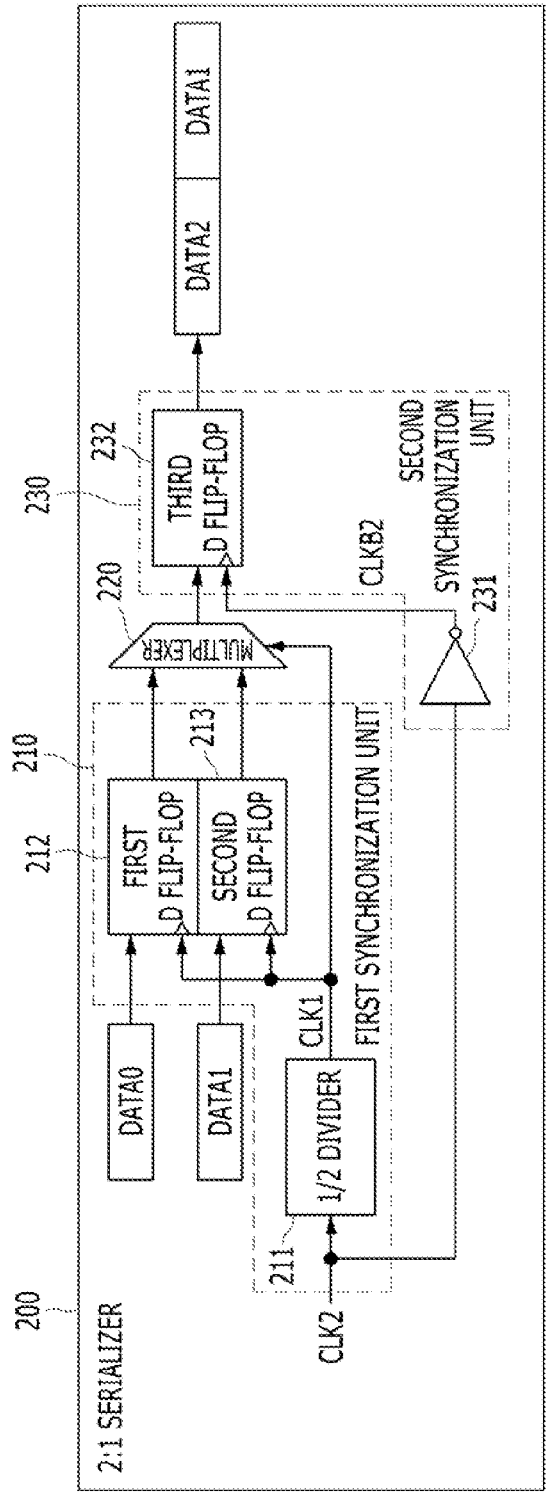
FIG. 2 is a configuration diagram Illustrating a 2:1 serializer shown in FIG. 1.

FIG. 2 is a configuration diagram illustrating the serializer in accordance with the embodiment of the present invention, and illustrates a detailed configuration diagram of the 2:1 serializer 200 shown in FIG. 1.

As illustrated in FIG. 2, the 2:1 serializer 200 in accordance with the embodiment of the present invention includes a first synchronization unit 210 for synchronizing input data with the first synchronization clock CLK1, a multiplexer 220 for serializing output data of the first synchronization unit 210 to 2:1 based on the first synchronization clock CLK1, and a second synchronization unit 230 for synchronizing output data of the multiplexer 220 with the inverted second synchronization clock CLKB2 having a frequency higher than that of the first synchronization clock CLK1 by a predetermined multiple.

The predetermined multiple is related to a serialization value of the multiplexer 220. That is, as illustrated in FIG. 2, when data are serialized to 2:1 in the multiplexer 220, the predetermined multiple is set to 2. In another example, when data are serialized to 4:1 in the multiplexer 220, the predetermined multiple may be set to 4.

The first synchronization unit 210 includes a ½ divider 211 for dividing a frequency of the inputted second synchronization clock CLK2 by the predetermined multiple, i.e., 2, and outputting the first synchronization clock CLK1, a first D flip-flop 212 for synchronizing first input data DATA1 with the first synchronization clock CLK1 outputted from the ½ divider 211, and a second D flip-flop 213 for synchronizing second input data DATA2 with the first synchronization clock CLK1 outputted from the ½ divider 211.

The multiplexer 220 serializes the first input data DATA1 outputted from the first D flip-flop 212 and the second input data DATA2 outputted from the second D flip-flop 213 to 2:1 based on the first synchronization clock CLK1 outputted from the ½ divider 211, and outputs the serialized data to the second synchronization unit 230.

The second synchronization unit 230 includes an inverter 231 for inverting the second synchronization clock CLK2 to output the Inverted second synchronization clock CLKB2, and a third D flip-flop 232 for synchronizing the serialized data outputted from the multiplexer 220 with the inverted second synchronization clock CLKB2 outputted from the inverter 231.

Figure 4:
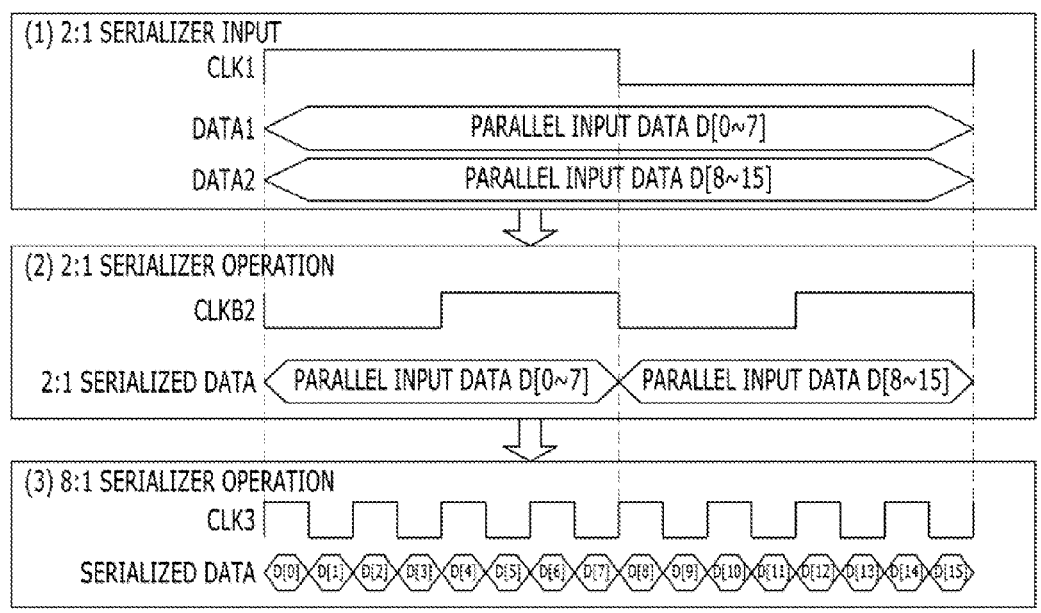
FIG. 4 is a timing diagram explaining an operation of a high speed serializing apparatus in accordance with an embodiment of the present invention.

As described above, in the 2:1 serializer 200, the first D flip-flop 212 and the second D flip-flop 213 are provided in order to synchronize the first and second input data DATA1 and DATA2 with the first synchronization clock CLK1 for controlling the multiplexer 220. Accordingly, as illustrated in FIG. 4, the first and second input data DATA1 and DATA2 are inputted at a rising edge of the first synchronization clock CLK1 and substantially maintained for one cycle of the first synchronization clock CLK1. Then, the multiplexer 220 serializes the first input data DATA1 and the second input data DATA2 to 2:1, and thus the first input data DATA1 and the second input data DATA2 are sequentially outputted at each ½ cycle of the first synchronization clock CLK1. The first synchronization clock CLK1 is obtained by dividing the frequency of the second synchronization clock CLK2 by 2. The rising edge of the first synchronization clock CLK1 is synchronized with a rising edge of the second synchronization clock CLK2. To maximize the set-up and hold margin of each data, the inverted second synchronization clock CLKB2 is inputted to the third D flip-flop 232 coupled to an output terminal of the multiplexer 220. Consequently, operation margin of the 2:1 serializer 200 may be increased and the 2:1 serializer 200 is less affected by initial glitch due to the third D flip-flop 232 of the output stage.

Figure 3:
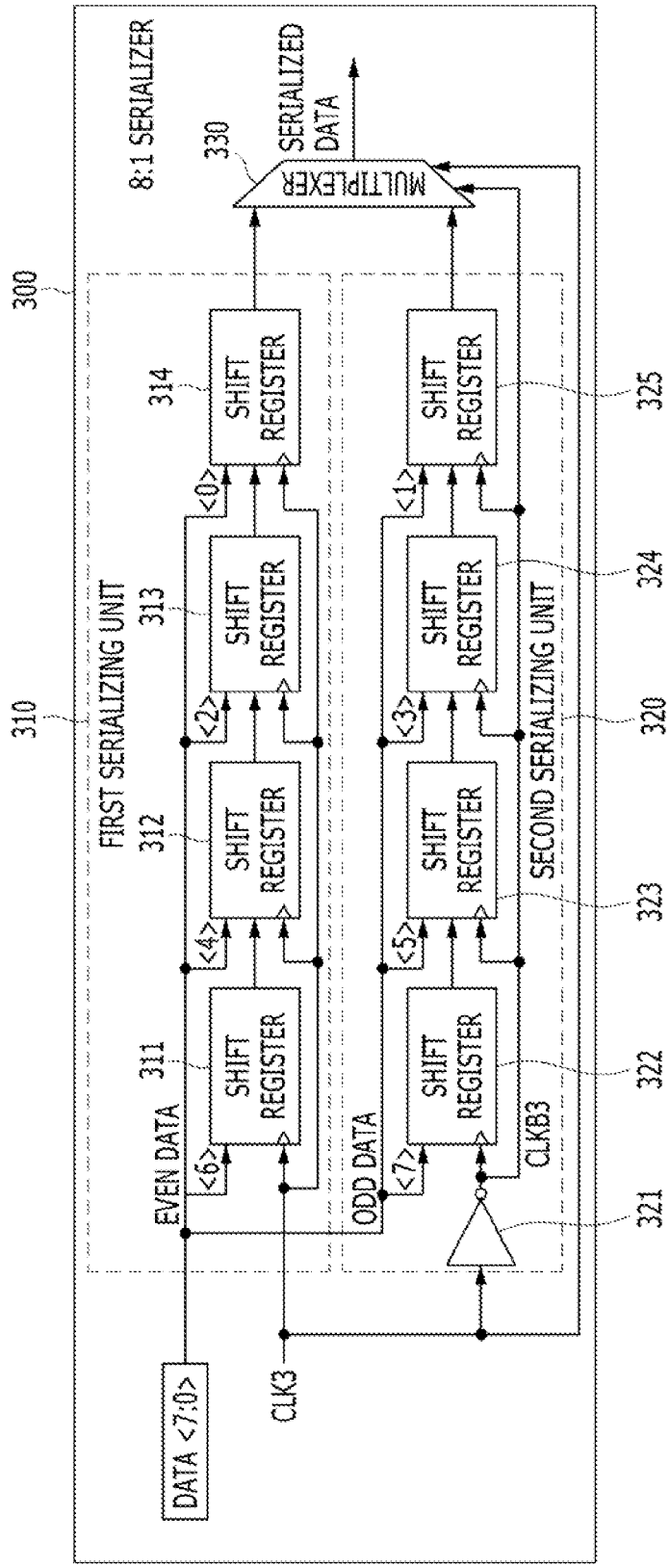
FIG. 3 is a detailed configuration diagram illustrating an 8:1 serializer shown in FIG. 1.

FIG. 3 is a detailed configuration diagram illustrating the 8:1 serializer 300 shown in FIG. 1.

As illustrated in FIG. 3, the 8:1 serializer 300 in accordance with the embodiment of the present invention includes a first serializing unit 310 for serializing even-bit data of the data outputted from the 2:1 serializer 200 to 4:1 by using shift registers 311 to 314 seriated to 4:1 based on a DDR bit clock corresponding to a third synchronization clock CLK3, a second serializing unit 320 for serializing odd-bit data of the data from the 2:1 serializer 200 to 4:1 by using shift registers 322 to 325 seriated to 4:1 in response to an inverted third synchronization clock CLKB3 inverted in an inverter 321, and a multiplexer 330 for serializing the even-bit data outputted from the first serializing unit 310 and the odd-bit data outputted from the second serializing unit 320 to 2:1 based on the third synchronization clock CLK3 and the inverted third synchronization clock CLKB3.

In this case, as illustrated in FIG. 4, the serialized data are outputted at rising and falling edges of the third synchronization clock CLK3 after data loading. Then, the multiplexer 330 operates in synchronization with the rising and falling edges of the third synchronization clock CLK3 so that the serialized data is finally serialized to 16:1. In this case, the third synchronization has a frequency higher than that of the first synchronization clock CLK1 by about eight times.

As described above, in the embodiment of the present invention, the serializer receives input data in synchronization with the first synchronization clock CLK1, and outputs data in synchronization with the inverted second synchronization clock CLKB2 having a frequency is higher than that of the first synchronization clock CLK1 by a predetermined multiple. Accordingly, a margin between a bit clock and data may be maximized in the 8:1 serializer using the shift registers, and higher speed serialization is possible.

Furthermore, the high speed serializing apparatus in accordance with the embodiment of the present invention may operate at 1.5 Gbits/s or more.

Although various embodiments have been described for illustrative purposes, it will be apparent to those skilled in the art that various changes and modifications may be made without departing from the spirit and scope of the invention as defined in the following claims.

What is claimed is:

1. A serializer comprising:
   a first synchronization unit suitable for synchronizing input data with a first synchronization clock;
   a multiplexer suitable for serializing output data of the first synchronization unit based on the first synchronization clock; and
   a second synchronization unit suitable for synchronizing output data of the multiplexer with a second synchronization clock which is different from the first synchronization clock in frequency.

2. The serializer of claim 1, wherein the second synchronization clock has a frequency higher than that of the first synchronization clock.

3. The serializer of claim 1, wherein the first synchronization unit comprises:
   a divider suitable for dividing a frequency of the second synchronization clock by a predetermined multiple and outputting the first synchronization clock;
   a first D flip-flop suitable for synchronizing first input data with the first synchronization clock; and
   a second D flip-flop suitable for synchronizing second input data with the first synchronization clock.

4. The serializer of claim 1, wherein the second synchronization unit comprises:
   an inverter suitable for inverting the second synchronization clock to output an inverted second synchronization clock; and
   a third D flip-flop suitable for synchronizing the output data of the multiplexer with the inverted second synchronization clock.

5. A serializing apparatus comprising:
   at least one first serializer suitable for serializing data by synchronizing data at an input stage with a first synchronization clock and synchronizing data at an output stage with a second synchronization clock having a frequency higher than that of the first synchronization clock by a predetermined multiple; and
   a second serializer suitable for serializing data outputted from the first serializer.

6. The serializing apparatus of claim 5, wherein the second serializer includes shift registers.

7. The serializing apparatus of claim 5, wherein the first serializer comprises:
   a first synchronization unit suitable for synchronizing input data with the first synchronization clock;
   a multiplexer suitable for serializing output data of the first synchronization unit based on the first synchronization clock; and
   a second synchronization unit suitable for synchronizing output data of the multiplexer with the second synchronization clock.

8. The serializing apparatus of claim 7, wherein the first synchronization unit comprises:
   a divider suitable for dividing a frequency of a second synchronization clock by the predetermined multiple to output the first synchronization clock;
   a first D flip-flop suitable for synchronizing first input data with the first synchronization clock; and a second D flip-flop suitable for synchronizing second input data with the first synchronization clock.

9. The serializing apparatus of claim 7, wherein the second synchronization unit comprises:

an inverter suitable for inverting the second synchronization clock to output an inverted second synchronization clock; and a third D flip-flop suitable for synchronizing data serialized in the multiplexer with the inverted second synchronization clock.

10. The serializing apparatus of claim 5, wherein the second serializer comprises:

a first serializing unit suitable for serializing even-bit data of the data outputted from the first serializer by using a plurality of first shift registers based on a third synchronization clock;

a second serializing unit suitable for serializing odd-bit data of the data outputted from the first serializer by using a plurality of second shift registers in response to an inverted third synchronization clock; and a multiplexer suitable for serializing the even-bit data outputted from the first serializing unit and the odd-bit data outputted from the second serializing unit in response to the third synchronization clock.

11. The serializing apparatus of claim 10, wherein the third synchronization clock has a frequency higher than that of the second synchronization clock by a multiple.

\* \* \* \* \*